(12) United States Patent
Kohashi et al.

(10) Patent No.: US 7,755,046 B2
(45) Date of Patent: Jul. 13, 2010

(54) TRANSMISSION ELECTRON MICROSCOPE

(75) Inventors: Teruo Kohashi, Hachioji (JP); Takashi Ohshima, Saitama (JP); Takao Matsumoto, Iruma (JP); Hirokazu Nishida, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 360 days.

(21) Appl. No.: 12/010,702

(22) Filed: Jan. 29, 2008

(65) Prior Publication Data

US 2008/0210868 A1 Sep. 4, 2008

(30) Foreign Application Priority Data

Mar. 1, 2007 (JP) .............................. 2007-050921

(51) Int. Cl.
*G01N 23/00* (2006.01)
*G21K 7/00* (2006.01)

(52) U.S. Cl. ...................................... 250/311; 250/306

(58) Field of Classification Search ................. 250/306, 250/307, 310, 311
See application file for complete search history.

(56) References Cited

U.S. PATENT DOCUMENTS

| | | | | |
|---|---|---|---|---|
| 4,455,486 A | * | 6/1984 | Rau | 250/306 |
| 4,658,138 A | * | 4/1987 | Koike et al. | 250/310 |
| 5,192,867 A | * | 3/1993 | Osakabe et al. | 250/311 |
| 5,444,243 A | * | 8/1995 | Kohhashi et al. | 250/305 |
| 5,877,510 A | | 3/1999 | Baba et al. | |
| 5,969,356 A | * | 10/1999 | Grzelakowski | 250/310 |
| 2001/0042830 A1 | * | 11/2001 | Kaneyama et al. | 250/311 |
| 2002/0084412 A1 | * | 7/2002 | Tomita | 250/311 |
| 2003/0066964 A1 | * | 4/2003 | Nagayama et al. | 250/311 |
| 2003/0122075 A1 | * | 7/2003 | Voelkl | 250/311 |
| 2004/0195506 A1 | * | 10/2004 | Wang et al. | 250/307 |
| 2007/0194230 A1 | * | 8/2007 | Kohashi et al. | 250/310 |

FOREIGN PATENT DOCUMENTS

| | | |
|---|---|---|
| JP | 64-065762 | 9/1987 |
| JP | 05-322839 | 5/1992 |
| JP | 05-323859 | 5/1992 |

OTHER PUBLICATIONS

Hattschneider, P. "The principle of CHIRALTEM" Vienna, 19.-20. 4.2006, presented Apr. 19, http://www.chiraltem.physics.at/Workshop2_Schattschneider.pdf, accessed Mar. 17, 2010.*

(Continued)

*Primary Examiner*—Bernard E Souw
*Assistant Examiner*—Brooke Purinton
(74) *Attorney, Agent, or Firm*—Stites & Harbison, PLLC; Juan Carlos A. Marquez, Esq.

(57) ABSTRACT

Chirality distribution in the molecular structure of protein or the like and magnetic domain structure are analyzed with high resolution less than 10 nm. A transmission electron microscope equipped with a spin-polarized electron source is used for holography observation. The phase of transmission spin-polarized electrons changes due to the existence of chirality structure or magnetization in a sample, which is observed as an interference pattern phase shift in holography measurement.

8 Claims, 10 Drawing Sheets

OTHER PUBLICATIONS

P. Schattschneider, S Rubino, C. Hebert, J. Rusz, J. Kunes, P. Novak, E. Carlino, M Fabriziola, G. Panacione, and G. Rossi. Nature (London) vol. 441, 486 (May 25, 2006).*

Rusz, Jan et al. "First Principle theory of chiral dichroism in electron microscopy applied to 3d ferromagnets" Physical Review B 75, 214425 (2007).*

Hebert et al. "A proposal for dichroic experiments in the electron microscope" Ultramicroscopy 96 (2003) 463-468.*

"Protein 3000 Project", The Third Sugar Chain Science Consortium Symposium, Medical Tribune (Feb. 16, 2006), p. 36, and 3 pages of English translation.

G. Lampel et al., "Proposal for an Efficient Source of Polarized Photoelectrons from Semiconductors", Solid State Communications, vol. 16, (1975), pp. 877-880.

T. Nakanishi et al., "Large Enhancement of Spin Polarization Observed by Photoelectrons from a Strained GaAs Layer", Physics Letters A, vol. 158 (1991), pp. 345-349.

Stefan Mayer et al., "Experimental Verification of Electron Optic Dichroism", Physical Review Letters, vol. 74, No. 24 (Jun. 12, 1995), pp. 4803-4806.

* cited by examiner

FIG. 5
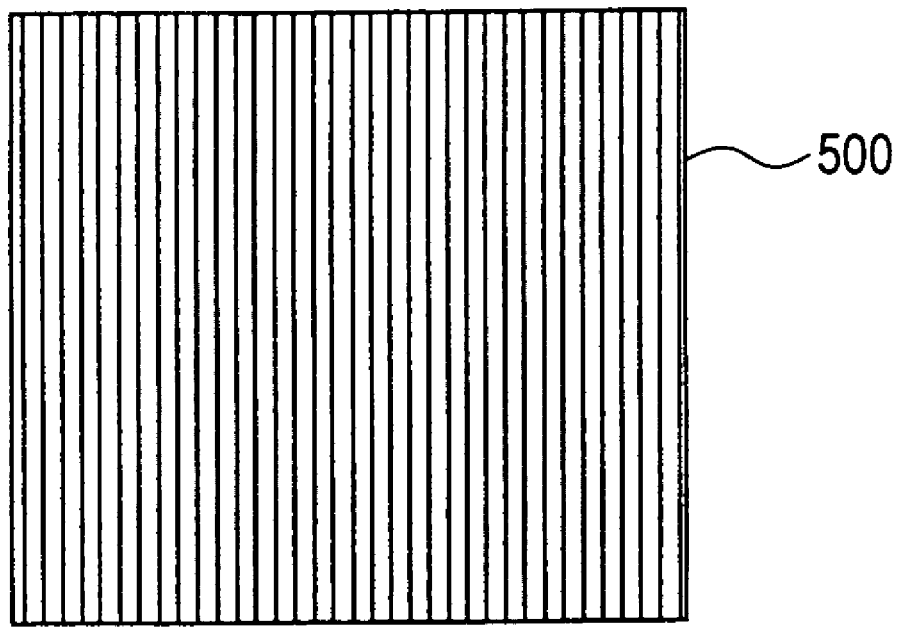
500
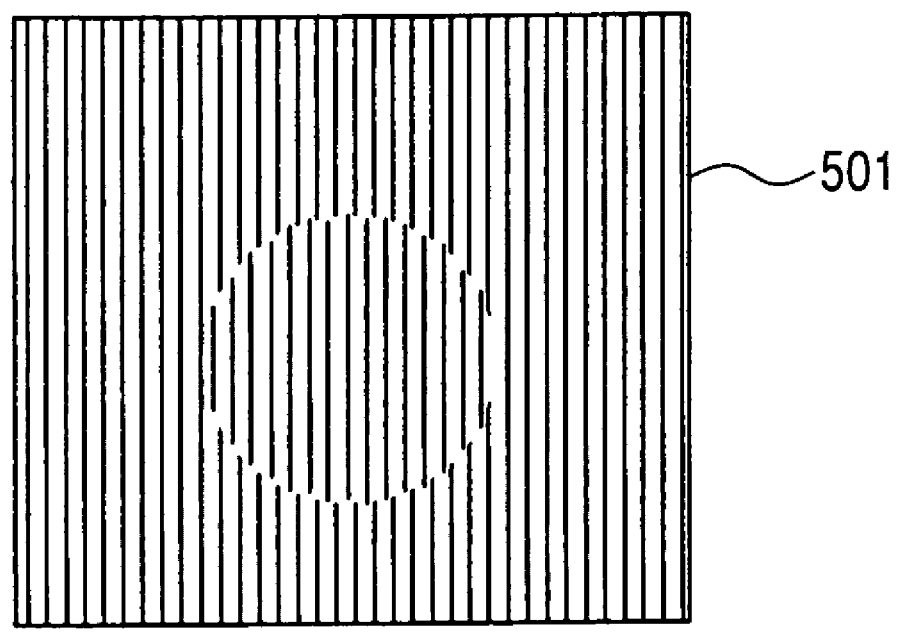
501

FIG. 6
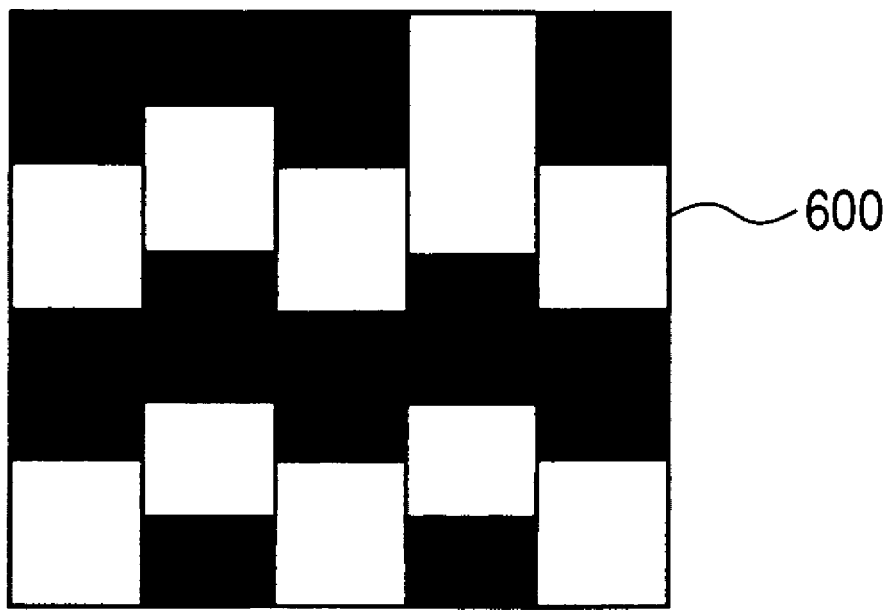
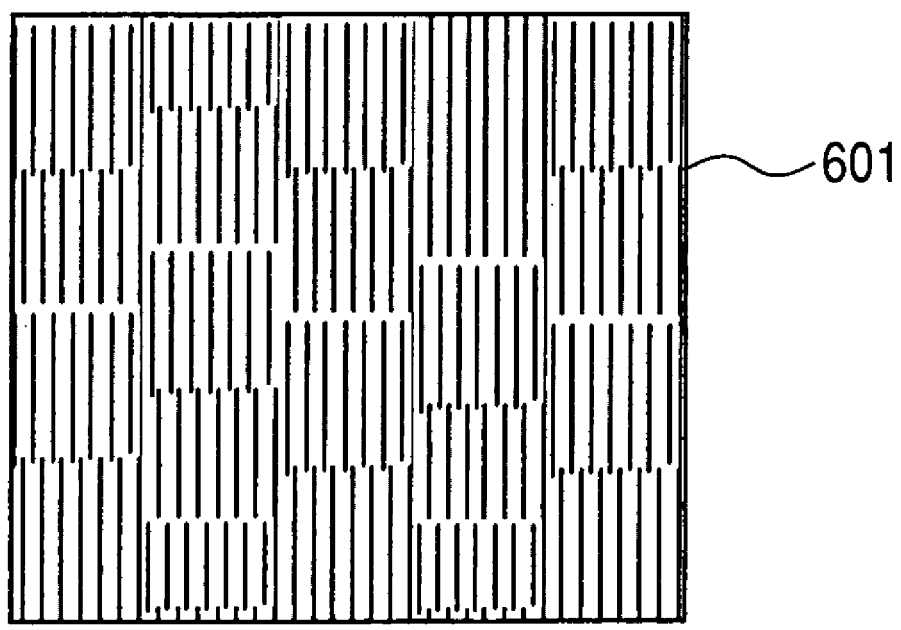

FIG. 8
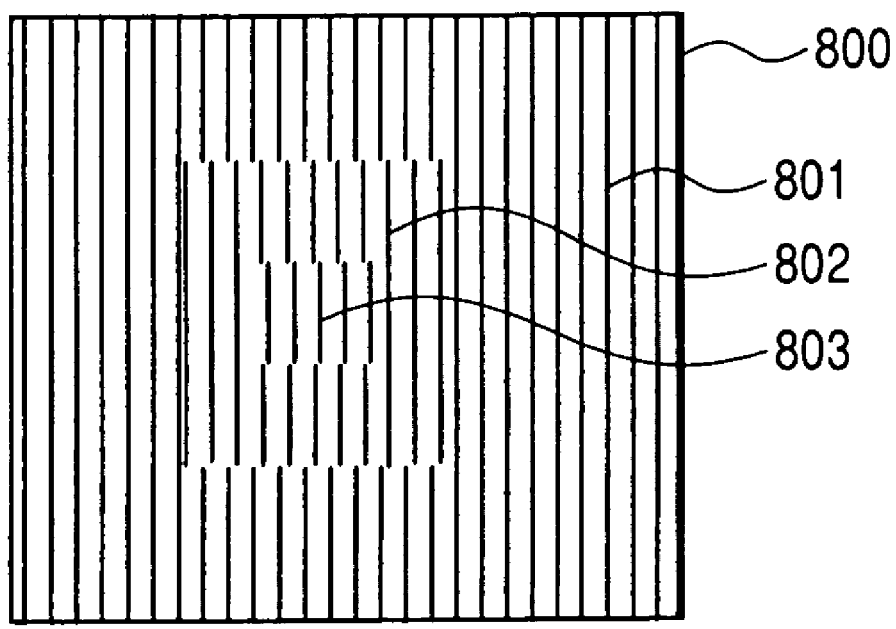
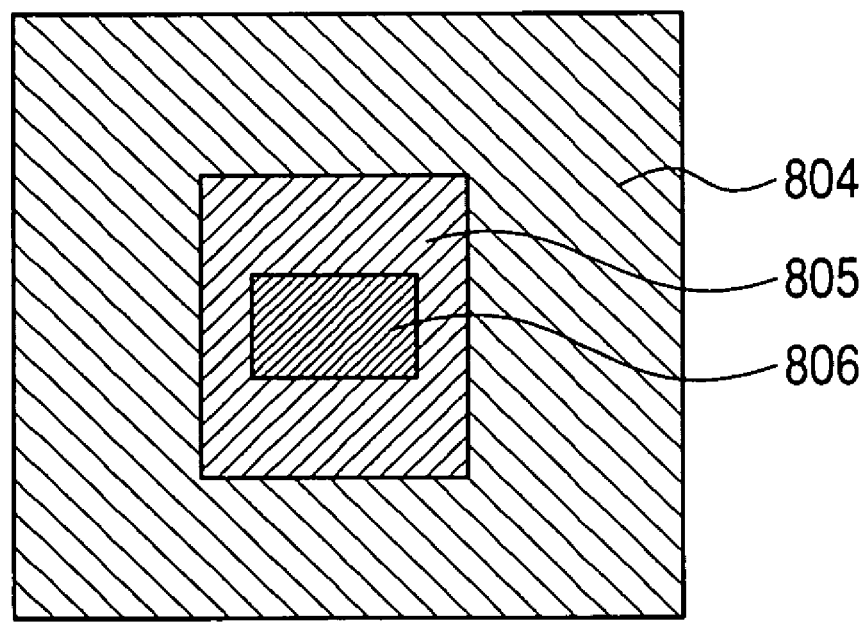

FIG. 9
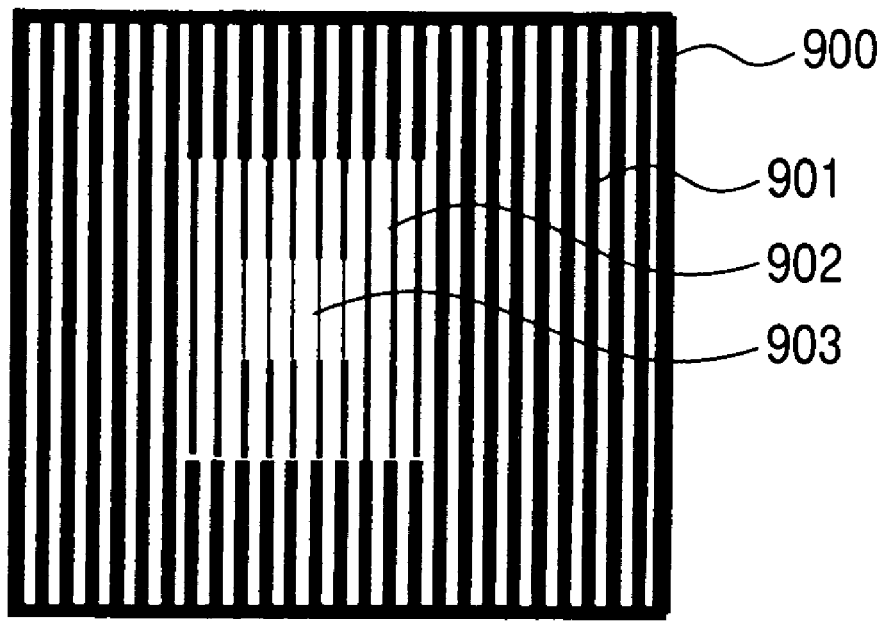
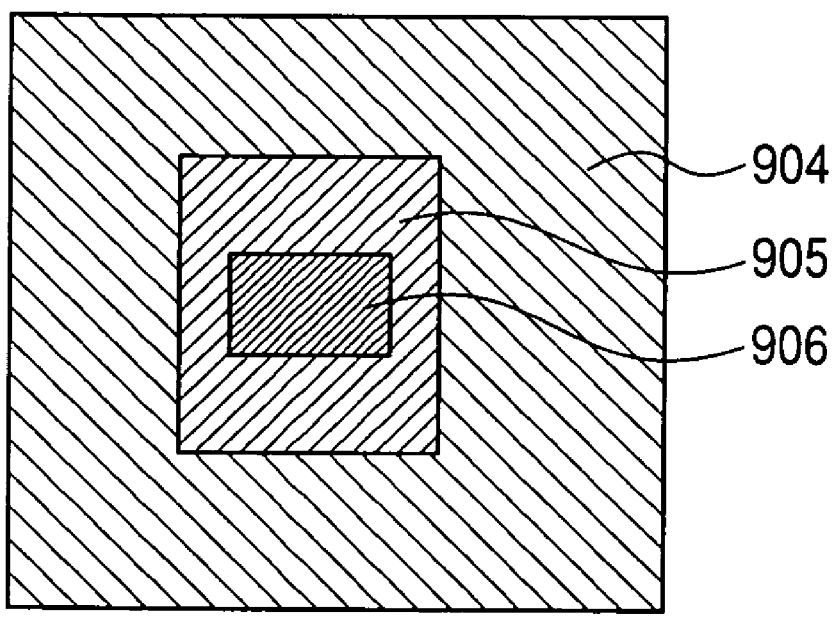

TRANSMISSION ELECTRON MICROSCOPE

CLAIM OF PRIORITY

The present application claims priority from Japanese application JP 2007-050921 filed on Mar. 1, 2007, the content of which is hereby incorporated by reference into this application.

FIELD OF THE INVENTION

The present invention relates to an apparatus for evaluating and analyzing the molecular structure of protein or the like or the magnetic domain structure of a magnetic substance.

BACKGROUND OF THE INVENTION

There has been much demand for analysis of the structures of high molecular compounds typified by protein, with advanced requests. That is, there have been many studies for analyzing the nature and function of protein as well as its structure and utilizing the results for medical and pharmaceutical sciences. X-ray diffraction is best known as a method of analyzing protein microstructure. X-ray diffraction requires the creation of a single crystal sample but enables high-resolution measurement, which is described for example in Medical Tribune (VOL. 39, p. 36, 2006). Other apparatuses for analyzing protein microstructure include a three-dimensional transmission electron microscope and an atomic force microscope.

At present, in the field of magnetic recording, hard disk bit lengths reach a 30-nm level. Accordingly, minute bit distortion may cause severe noise, and there is a need for recording for controlling bit shapes more accurately than ever. However, there are few methods for evaluating whether a recording bit shape is distorted, and expectations are rising for magnetic domain observation with high resolution less than 10 nm. Both in perpendicular magnetic recording which has recently been commercialized and in longitudinal magnetic recording which has conventionally been employed, such bit shape evaluation is important. Since crystal grain sizes are currently less than 10 nm, a resolution of a few nm is required for magnetic domain observation. Among current general-purpose high-resolution magnetic domain observation apparatuses, a Lorentz electron microscope can provide the highest resolution. In the Lorentz electron microscope, an electron beam is acted upon by Lorentz force due to a leakage magnetic field from a sample, and a deflection thereof makes a signal. Therefore, in theory, only the magnetization component perpendicular to the incident direction of an electron beam is detected.

Further, two electron beam technologies important to the invention will be described. One is electron beam holography. This is utilized as a method for measuring an electromagnetic field in a minute area. An electron beam changes its phase by an electromagnetic field in a vacuum or in a substance. An ordinary electron beam detection apparatus can record only the intensity distribution of the electron beam, and cannot measure the phase of the electrons without any processing. In order to record the phase change of the electron beam that has passed through the electromagnetic field, it is necessary to convert the phase change into the intensity distribution. In the electron beam holography method, an electron beam biprism apparatus records the intensity distribution of a striped interference pattern generated by the superposition of an electron beam that has passed through a vacuum near the sample (reference wave), thereby achieving this conversion. Measurement methods using the electron beam holography are disclosed, for example, in JP-A No. 64 (1989)-065762, JP-A No. 05 (1993)-322839, and JP-A No. 05 (1993)-323859.

The other is a spin-polarized electron source. Among others, attention is being given to a spin-polarized electron source of a type that irradiates a semiconductor such as GaAs with circularly polarized light, which is described for example in Solid State Communication, Vol. 16, p. 877, 1975 by G. Lanpel et al. An invention for improving spin polarization by using a distorted semiconductor is disclosed in JP-A No. 07 (1995)-320633, and a similar description is written in Physics Letters A, Vol, 158, p. 345, 1991 by Nakanishi et al.

SUMMARY OF THE INVENTION

Protein has a primary structure in terms of the type of amino acid and a secondary structure in terms of how amino acids link. The secondary structure is broadly divided into an alpha helix having a helical structure and a beta sheet having a plate-like structure. This categorization is important for the structural analysis of protein. For example, in order to examine the process of structural change of protein in response to a stimulus or the effect of an impurity on protein structure, it is necessary to examine what distribution the alpha helix and the beta sheet have for structural change or the ratio of each structure at a location not in proximity to the impurity. It is expected that there will be an increasing demand for such structural analysis of not only protein but also other substances. In conventional X-ray diffraction, while data can be acquired with good resolution, it is basically impossible to map the distribution of molecular structure due to a single crystal. There is a case where a three-dimensional TEM or an atomic force microscope is used for structural analysis. However, in this case, there is a limit in sample size, with a restricted field of view. Therefore, in current apparatuses, it is difficult to map the distribution of protein structure.

In high-resolution magnetic domain observation, the magnetic flux component that the Lorentz microscope can detect is only the perpendicular direction to the orbit of a transmission electron beam. Therefore, in the case where an electron beam falls perpendicularly on the surface of a thin-film sample as in observation with an ordinary transmission electron microscope, it is difficult to detect the magnetization of a perpendicular magnetization film such as perpendicular magnetic recording on a hard disk. Thus, in current apparatuses, it is difficult to perform high-resolution magnetic domain observation of a perpendicular magnetization film.

A structure having mirror symmetry such as dextrality and sinistrality is referred to as chirality. A big point to distinguish the alpha helix from the beta sheet is that the alpha helix has chirality due to the helical structure whereas the beta sheet does not have it. A technique using polarized light has conventionally been known as a method for finding such a chirality structure. If the molecular structure of a sample has chirality, there occurs a difference in transmittance between left-handed circularly polarized light and right-handed circularly polarized light. This is referred to as circular dichroism. Further, a difference of transmission condition in the sample arises between left-handed circularly polarized light and right-handed circularly polarized light, which may cause a phase difference. This is also known as a phenomenon of polarization plane rotation in using linearly polarized light, named Faraday rotation or optical rotation. The circular dichroism or the optical rotation occurs also in a magnetic sample. That is, when left-handed circularly polarized light and right-handed circularly polarized light pass through a thin-film magnetic sample having magnetization parallel/antiparallel to a transmission direction, dichroism or optical rotation occurs. By utilizing it, it is possible to visualize magnetization distribution. The main point of the present invention is a structural analysis using an electron beam instead of a light.

The present invention provides the following transmission electron microscope as means for simultaneously satisfying the functions of molecular structure analysis and high-resolution magnetic domain observation described above. A spin-polarized electron source of a type that irradiates a semiconductor such as GaAs with circularly polarized light is used as an electron source. In this case, by switching between left-handed circularly polarized light and right-handed circularly polarized light, the spin polarization of an emitted electron beam can be reversed. A spin rotator for rotating the spin polarization of the electron beam is mounted in an optical system for guiding the emitted spin-polarized electron beam. The spin rotator generates a magnetic field therein to rotate electron spin by Larmor precession, which is rotation in a plane perpendicular to the direction of application of a magnetic field. In the case of having the function of three-dimensionally rotating the spin polarization in the direction of an arbitrary solid angle, since two rotation axes are required for the spin polarization, two spin rotators having different directions of application of the magnetic field are needed to be arranged in series. Among various types of spin rotators, for example a Wien filter type in which an electric field and a magnetic field are orthogonal to an electron orbit is an appropriate one. Alternatively, one of the two spin rotators may be a magnetic coil type which applies a magnetic field in the direction of an electron orbit. However, for the spin-polarized electron beam generated by irradiating a semiconductor such as GaAs with circularly polarized light as described, the spin polarization thereof points in the direction of the electron orbit; therefore, in the spin rotator of the magnetic coil type which applies the magnetic field in the direction of the electron orbit, the spin polarization does not rotate without being processed. In this respect, the magnetic coil type is not suitable for the first one of the two spin rotators. The electrons are then carried by the optical system. A part of the electrons are applied to a sample, whereas the other part of the electrons passes as they are in a vacuum. Then, the electron beams that have passed through the above two routes are deflected by an electron beam biprism to interfere with each other on a screen placed after the biprism. The interference pattern projected on the screen is captured by a camera, and the acquired data is forwarded to an image processing/analysis system.

The configuration of the above apparatus is similar to that of the electron beam holography apparatus, but decisively different in that the irradiating electron beam is spin-polarized. Therefore, the above apparatus can detect a physical quantity that cannot be detected by the electron beam holography. In general, the spin polarization of an electron beam can correspond to the polarization of light. For example, the interaction between an electron beam that is spin-polarized in the traveling direction of the electron beam and a sample corresponds to the interaction between left- and right-handed circularly polarized light and a sample. Phenomena such as the above-described dichroism and optical rotation also correspond, and experimental confirmation has been made as to the dichroism (e.g., Physical Review Letters Vol. 74, pp. 4803-4806 (1995)). That is, when electron beams having different spin polarization directions pass through a sample having a chirality structure, a transmittance difference and a phase shift occur. With the use of the phase shift, there occurs a difference in striped interference pattern.

When electron beam holography measurement is performed in the above apparatus configuration, an interference pattern appears on the screen. In an ordinary electron beam holography apparatus, electric potential distribution, vector potential, and the like change the phase of an electron beam to cause a difference in interference pattern. Accordingly, in the case where there is no electric potential distribution or vector potential distribution, a uniform interference pattern appears in the ordinary electron beam holography. On the other hand, in the case of using an spin-polarized electron beam, assuming that the sample includes a portion with chirality structure and a portion without chirality structure, an electron beam that has passed through the portion with chirality structure causes a phase shift, which leads to an interference pattern shift. With the use of this method, the distribution of portions with chirality structure can be found based on information on portions where an interference pattern is shifted. Thus, it is an advantage of the invention to detect chirality in molecular structure which is completely different from physical quantities such as electric potential and vector potential that can detected by the ordinary electron beam holography. While the invention utilizes the phase difference of the spin-polarized electron beam, also the dichroism utilizing a transmittance difference is effective. However, in this method, the wavelength of an electron beam or light of a large difference in transmittance is limited depending on the sample; therefore, compared therewith, the method according to the invention utilizing the phase difference can be used for various purposes.

The amount of interference pattern shift is related to the thickness of the sample and the chirality structure in a film thickness direction, and also affected by the angle between the direction of a spin polarization vector and the symmetry axis of chirality. Accordingly, as the spin rotator changes the direction of the spin polarization, the amount of interference pattern shift changes. When data is acquired by thus changing the angle of the spin polarization vector with the spin rotator, findings about the direction of the symmetry axis of the chirality structure can be obtained.

A similar effect can be exerted on a magnetic sample. That is, the phase shift of the electron beam occurs depending on whether the spin polarization vector is parallel or antiparallel to the magnetization direction in the thin-film sample. Accordingly, in a holographic image, data in which the interference pattern is partially shifted depending on the magnetization direction can be acquired, thereby making it possible to analyze the magnetic domain structure. Particularly, in the case where the magnetization of the thin-film sample is perpendicular to the film, an ordinary transmission electron microscope such as the Lorentz microscope cannot detect the magnetization, whereas this method enables it. In this case as well, the amount of phase shift changes depending not only on the film thickness of the sample and the magnetization distribution in a film thickness direction, but also on the relationship between the spin polarization vector of the irradiating electron beam and the direction of magnetization of the sample. Accordingly, as the spin rotator changes the direction of the spin polarization, the amount of interference pattern shift changes. When data is acquired by thus changing the angle of the spin polarization vector with the spin rotator, findings about the direction of magnetization in the sample can be obtained.

As described above, with the use of the spin-polarized electron beam holography according to the invention, it is possible to provide an apparatus capable of mapping the chirality in the molecular structure of various samples and the magnetization of a magnetic thin film.

According to the invention, as described above, in analyzing the molecular structure of protein or the like, it is possible to provide means for achieving the mapping of an area of chirality with high resolution less than 10 nm. Further, it is possible to provide means for, with the resolution of a Lorentz microscope level, visualizing magnetization distribution, perpendicular to a sample film surface, which cannot be detected by the Lorentz microscope.

BRIEF DESCRIPTION OF THE DRAWINGS

FIG. 5 shows an example of interference patterns in the case of a sample without chirality structure and a sample with chirality structure, according to the invention;

FIG. 6 shows an example of a recording state of a perpendicular magnetic recording medium as an observation object and an interference pattern obtained by spin-polarized electron beam holography measurement, according to the invention;

FIG. 8 shows an interference pattern having phase shift distribution and an illustration in which contrasts are created in accordance with the amount of phase shift, in spin-polarized electron beam holography measurement according to the invention;

FIG. 9 shows an interference pattern having intensity distribution and an illustration in which contrasts are created in accordance with interference pattern intensity, in spin-polarized electron beam holography measurement according to the invention.

DETAILED DESCRIPTION OF THE PREFERRED EMBODIMENTS

First Embodiment

Hereinafter, embodiments of the present invention will be described with reference to the accompanying drawings.

Figure 1:
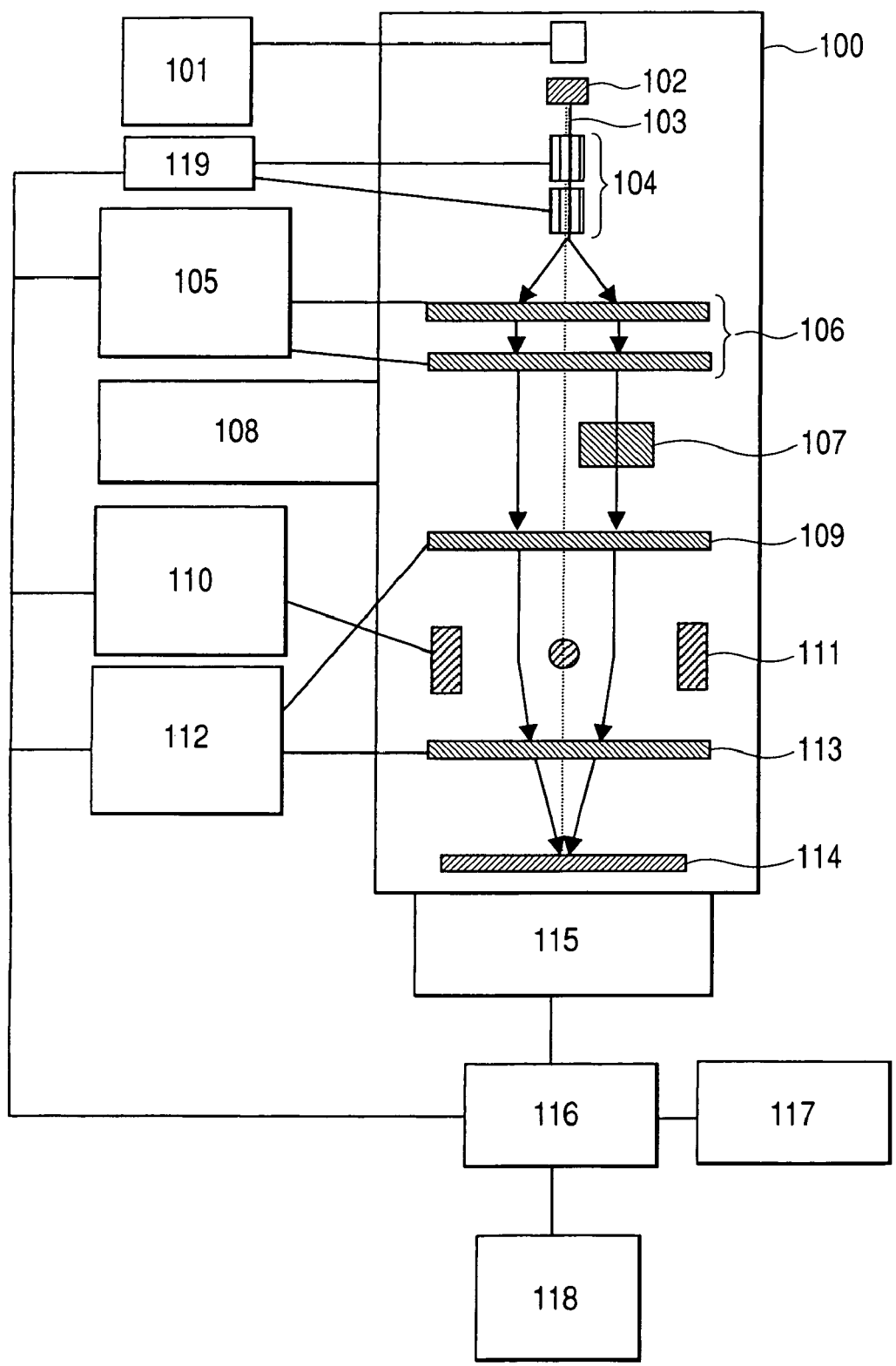
FIG. 1 is a configuration diagram of a spin-polarized electron beam holography apparatus according to an embodiment of the present invention.

FIG. 1 shows a rough configuration of a spin-polarized electron beam holography apparatus according to the present invention. The entire apparatus is based on a transmission electron microscope, and is broadly divided into units incorporated in a vacuum chamber 100 and control units etc. in the air. A spin-polarized electron source 102 is controlled by a spin-polarized electron beam controller 101. For example, a type that excites a semiconductor such as GaAs with circularly polarized light may be used as the spin-polarized electron source 102, in which the wavelength of exciting light and the direction of circularly polarized light can be controlled by the spin-polarized electron beam controller 101. Emitted spin-polarized electrons are guided by a spin rotator 104 for adjustment of the angle. The strength of the spin rotator, that is, the magnitude and direction of a spin rotation angle is controlled by a spin rotator controller 119. As described above, two rotators of the spin rotator 104 enable rotation in all directions.

The spin rotator 104 includes a Wien filter type which applies an electromagnetic field orthogonal to an electron orbit and a type which applies a magnetic field in the direction of an electron orbit. The spin rotator 104 may be mounted at any location before electron beam irradiation of a sample in the entire optical system. In this embodiment, the spin-polarized electron beam passes through the spin rotator 104 and is guided by an electron optical system 106 composed of various electron lenses. The electron optical system 106 is controlled by an electron optical system controller 105. The electron optical system 106 is preferably composed of electrostatic lenses in consideration of effect on spin polarization. A part of the spin-polarized electron beam is applied to a sample 107, whereas the other part of the spin-polarized electron beam, as a reference wave, passes by the sample.

A description will be made on sample preparation. In the case where the sample is a living organism such as protein, it needs to be frozen in advance. For this reason, a sample freezer 108 is installed. It may be one for use in ordinary living organism TEM observation. In the case of one of the other thin-film samples, it does not need to be frozen in particular; therefore, the thin-film sample is set as it is. The spin-polarized electron beam that has passed through the sample and the reference wave then pass through an electron optical system 109 and are guided by a biprism 111. The biprism 111 deflects orbits by electrostatic force in order to allow electron beams to interfere with each other on a screen, and is controlled by a biprism controller 110. They then pass through an electron optical system 113 and make an interference pattern on a screen 114. In this embodiment, a screen is used as a detector for transmitted electrons; however, a detector in which electron detecting elements are two-dimensionally arranged may be used. The electron optical systems 109 and 113 are controlled by an electron optical system controller 112. The interference pattern on the screen 114 is captured by a camera 115 and sent to an image processing/analysis system 116, where the physical properties (e.g., magnetization direction, molecular arrangement direction, etc.) of the sample are analyzed.

An image signal outputted from the camera 115 is sent to a data storage unit 117 and a monitor 118. It is convenient if a system for automatically adjusting the spin rotator 104, the biprism 111, and the electron optical systems 106, 109, and 113 based on the result of the image processing/analysis system 116 is mounted. Accordingly, the image processing/analysis system 116 can communicate with the spin rotator controller 119, the electron optical system controllers 105 and 112, the biprism controller 110, and the like.

Figure 2:
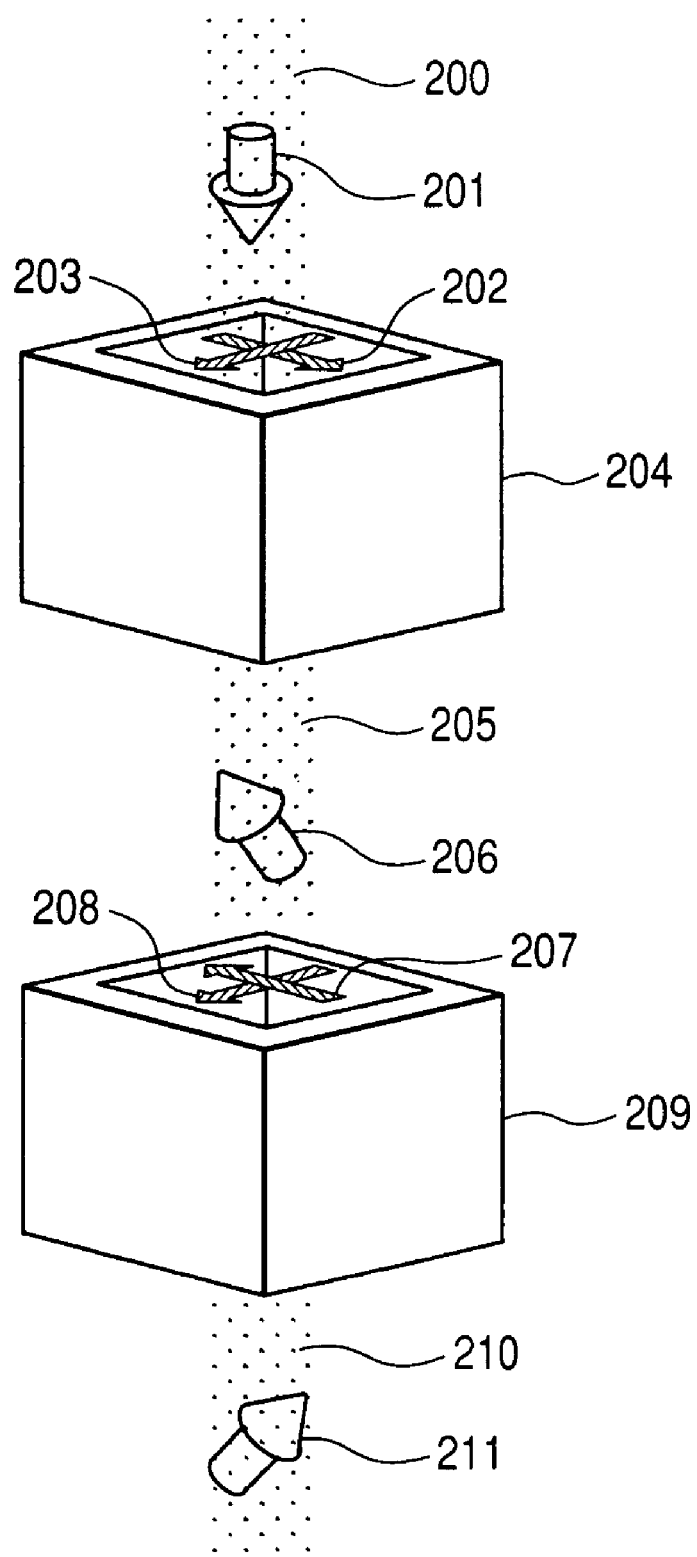
FIG. 2 shows a configuration example of spin rotators capable of rotating the spin polarization of an electron beam in all directions, according to the invention.

FIG. 2 is a schematic view of spin polarization vector rotation by spin rotators according to the invention. In FIG. 2, assume that a spin polarization vector 201 points in the traveling direction of a spin-polarized electron beam 200. This direction can be achieved, for example, in the case of using GaAs excited with circularly polarized light by the spin-polarized electron source 102 in the apparatus configuration shown in FIG. 1. The spin-polarized electron beam 200 passes through a spin rotator 204 of the Wien filter type in which magnetic flux lines 202 and electric flux lines 203 are orthogonal to the electron orbit. At this time, the spin rotator 204 adjusts the magnitude of an electromagnetic field so as to cancel Lorentz force and electrostatic force, so that a spin-polarized electron beam 205 passes substantially straight through the spin rotator. Due to Larmor precession, a spin polarization vector 206 rotates by a certain angle in a plane perpendicular to the magnetic flux lines 202. The spin-polarized electron beam 205 is then guided by a second spin rotator 209. In the second spin rotator 209 as well, electric flux lines 207 and magnetic flux lines 208 are applied so as to be orthogonal to the electron orbit, but the direction of the electromagnetic field is rotated 90 degrees with respect to that of the first spin rotator 204. For this reason, in the second spin rotator 209, the spin polarization vector 206 rotates in a plane different from that of the first spin rotator 204. The two rotations enable a spin polarization vector 211 to rotate in all directions, namely, in an arbitrary direction. Further, a spin-polarized electron beam 210 goes straight on.

Figure 3:
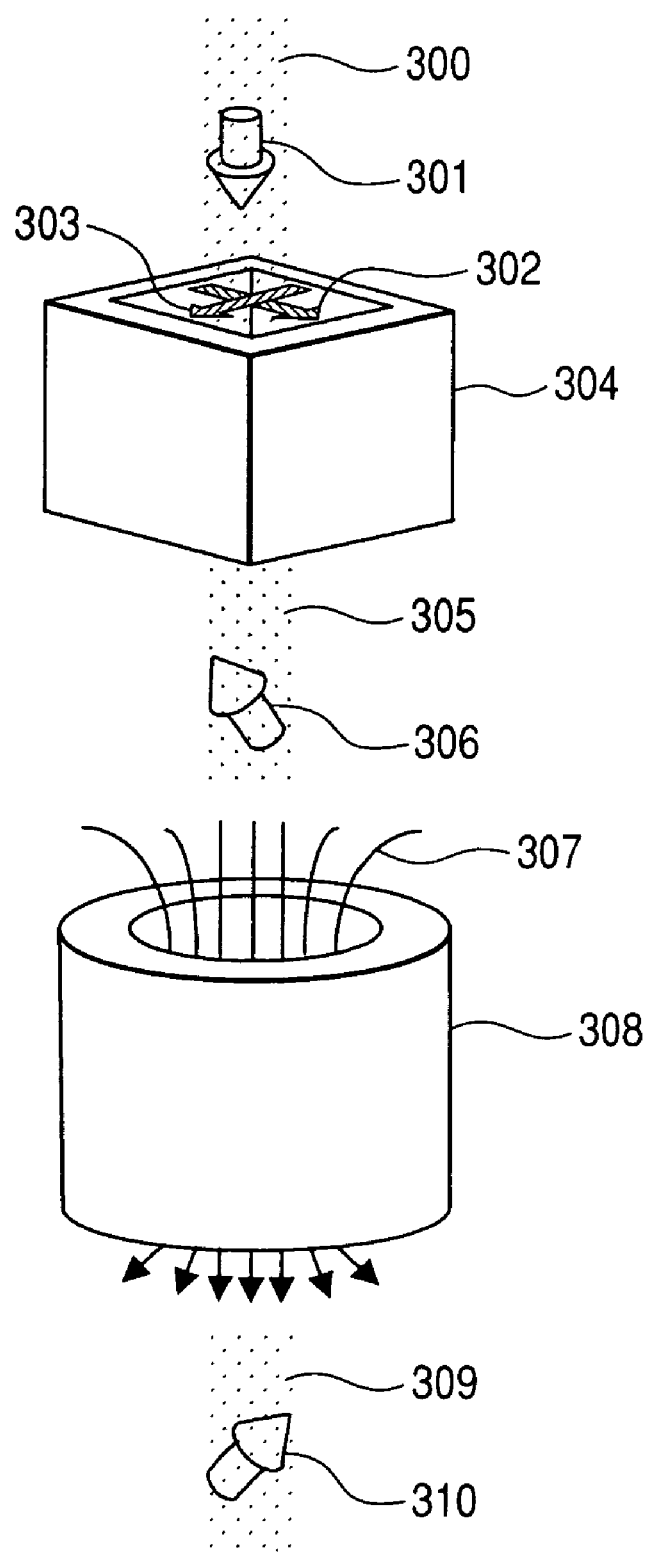
FIG. 3 shows another configuration example of spin rotators capable of rotating the spin polarization of an electron beam in all directions, according to the invention.

FIG. 3 shows another example of spin polarization rotators according to the invention. As in the case of FIG. 2, assume that a spin polarization vector 301 points in the traveling direction of a spin-polarized electron beam 300. The spin-polarized electron beam 300 passes through a spin rotator 304 of the Wien filter type in which magnetic flux lines 302 and electric flux lines 303 are orthogonal to the electron orbit, and a spin polarization vector 306 rotates in a plane perpendicular to the magnetic flux lines 302. A spin-polarized electron beam 305 is then guided by a spin rotator 308 of a type in which magnetic flux lines 307 are parallel to the electron orbit. In the spin rotator 308, since the magnetic flux lines 307 are parallel to the electron orbit, Lorentz force hardly acts, so that a spin-polarized electron beam 309 goes straight on. Meanwhile, a spin polarization vector 310 rotates in a plane perpendicular to the magnetic flux lines 307. The combination of the spin rotators 304 and 308 also can rotate the spin polarization in all directions without changing the spin-polarized electron orbit.

Figure 4:
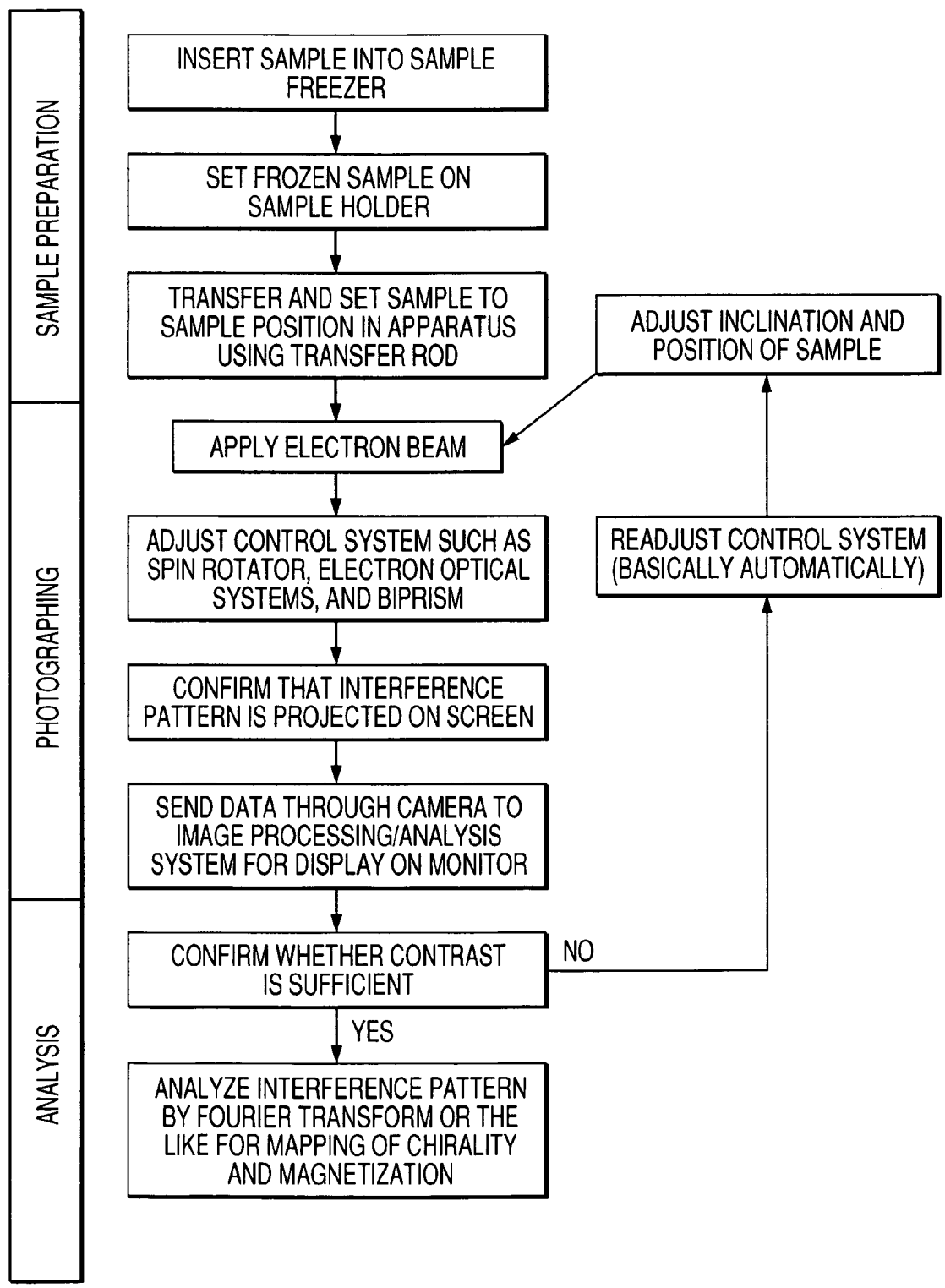
FIG. 4 is a flowchart showing a procedure from sample setting to data analysis in spin-polarized electron beam holography measurement, according to the invention.

FIG. 4 is a flowchart showing an actual observation procedure. In the example of FIG. 4, the molecular structure of protein or the like is analyzed with reference to FIG. 1. First, a thin-film sample to be observed is placed on the sample freezer 108 to be frozen. After the completion of the freezing, the sample is set on a sample holder and inserted as the sample 107 into the vacuum chamber 100 using a transfer rod. Then, the spin-polarized electron source controller 101 is operated to allow the spin-polarized electron source 102 to emit an electron beam. Then, the spin rotator controller 119, the electron optical system controllers 105 and 112, and the biprism controller 110 are operated to adjust the spin rotator 104, the electron optical systems 106, 109, and 113, and the biprism 111 for electron beam irradiation of the sample 107, so that an interference pattern is projected onto the screen 114.

The interference pattern data is sent through the camera 115 to the image processing/analysis system 116 for display on the monitor 118. The electron optical system controllers 105 and 112, and the biprism controller 110 are adjusted manually until a certain level of interference pattern appears. When the interference pattern appears, the spin rotator 104, the electron optical systems 106, 109, and 113, and the biprism 111 are adjusted so as to maximize the intensity of the interference pattern in the image processing/analysis system 116. If the contrast of the interference pattern is still weak, the position and inclination of the sample 107 is adjusted. When an adequate interference pattern is obtained, data acquisition is started. A sampling time in accordance with a purpose and a sample position are determined each time. The acquired data is stored in the image processing/analysis system 116. In order to deal with an S/N problem and the like, it is effective to employ a method in which the spin-polarized electron source controller 101 is operated so that the spin polarization of electrons emitted from the spin-polarized electron source 102 is reversed to acquire the second data, thereby observing the difference therebetween. The function of automatic adjustment of the spin rotator 104, the electron optical systems 106, 109, and 113, and the biprism 111 by the image processing/analysis system 116 will be described later. The last acquired data is analyzed by Fourier transform or the like for mapping of chirality and magnetization.

FIG. 5 shows an example of interference patterns according to the invention. The upper diagram shows a uniform interference pattern 500 in the case of no chirality in terms of magnetism and molecular structure. The lower diagram shows an interference pattern 501 in the case of a sample including a circular portion of different chirality in the center. That is, in the electron beam that has passed through the sample, there is a portion causing a phase shift in the center, which leads to such an interference pattern.

FIG. 6 shows an example of an interference pattern in a state of perpendicular magnetic recording, according to the invention. The upper diagram shows an example of a recording state 600 of a perpendicular magnetic recording film. The black-and-white contrast represents the direction of perpendicular magnetization. In the upper diagram, tracks run vertically. The lower diagram shows an interference pattern 601 corresponding to this recording state. The black-and-white magnetic contrast in the upper diagram leads to the display of interference pattern shifts in the lower diagram.

Figure 7:
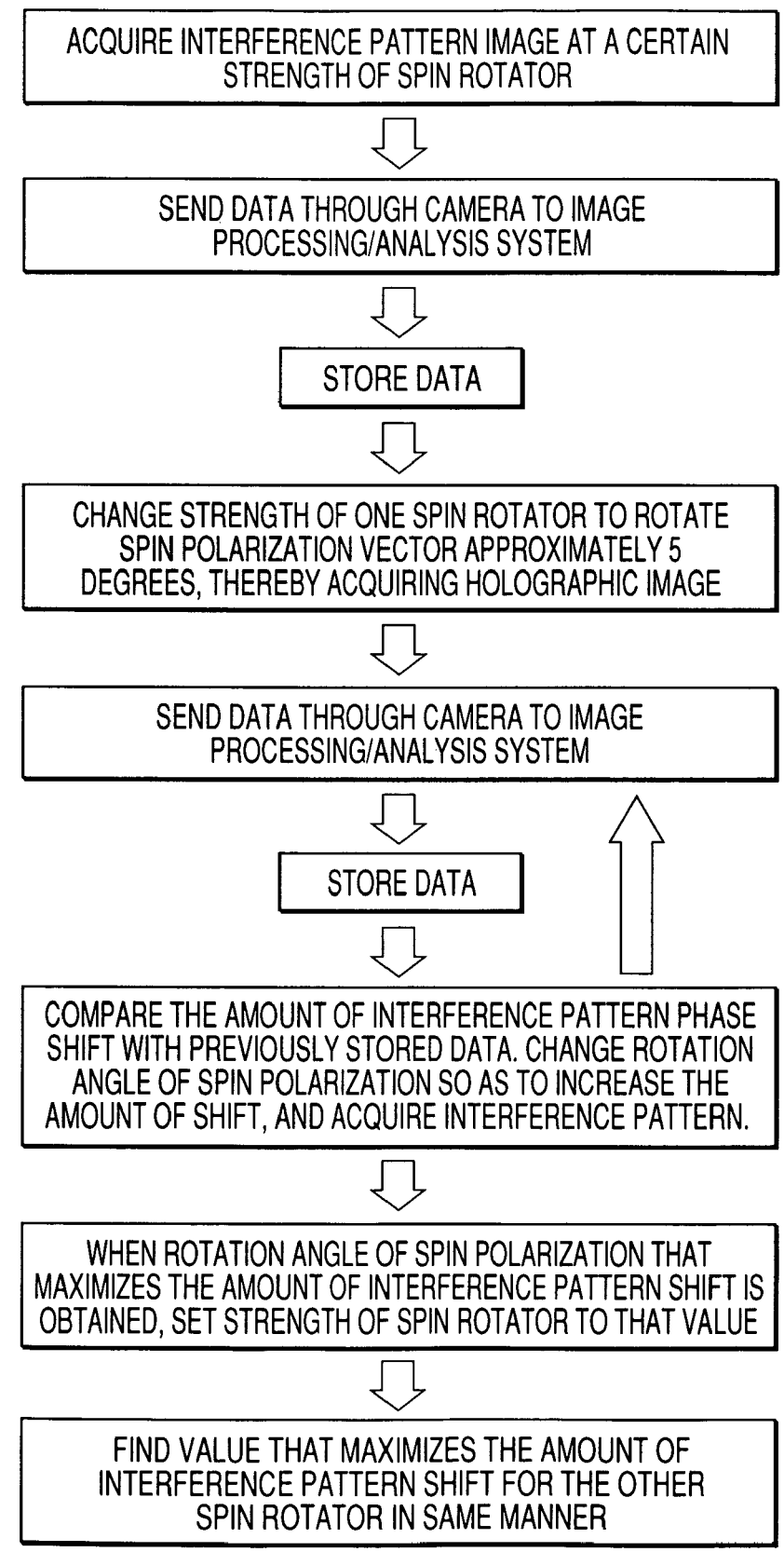
FIG. 7 is a flowchart of the vector analysis of chirality structure and magnetization direction, using spin rotators according to the invention.

FIG. 7 is a flowchart showing an example of a data acquisition procedure using spin rotators, according to the invention. First, data is acquired with a certain strength of spin rotators. The data is sent to the image processing/analysis system and stored therein. Then, the strength of one spin rotator is changed to rotate a spin polarization vector, e.g., approximately 5 degrees, and an interference pattern is acquired. This data also is stored, and the amount of interference pattern phase shift is compared with the previously stored data. Further, the rotation angle of the spin polarization is changed so as to increase the amount of shift, and an interference pattern is acquired in the same manner. The acquired data is stored and compared with the larger amount of interference pattern shift in the previous comparison, and the strength of the spin rotator is further adjusted so as to increase the shift.

When the optimum strength of the one spin rotator is found by repeating such adjustment, the strength of the spin rotator is set to that value. Further, the same operation is performed on the other spin rotator so as to find an optimum strength based on the amount of interference pattern shift. Through such a process, the direction of the spin polarization vector of the electron beam that maximizes the amount of phase shift is obtained, thereby enabling the vector analysis of helical direction in molecular structure, magnetization direction, and the like. A holographic image is acquired by taking time. The above method is important not only for acquiring an image with good S/N, but also for obtaining findings about chirality structure and magnetization direction. There is a more simple method for performing vector analysis. For example, adjusting the strengths of two spin rotators and acquiring data in a total of three directions which are one direction parallel to an electron beam incident direction and two directions perpendicular thereto also enables the vector analysis of helical direction in molecular structure, magnetization direction, and the like.

FIG. 8 shows an example of a method for analyzing data from an acquired interference pattern, according to the invention. In the upper diagram, in an observation area 800, there are a reference interference pattern 801 which occupies most of the observation area 800, an area 802 of a slightly shifted interference pattern phase from the reference interference pattern 801, and an area 803 of a considerably shifted interference pattern phase from the reference interference pattern 801. The image processing/analysis system 116 Fourier-transforms acquired data to quantify the amount of phase shift. The lower diagram is an illustration in which contrasts are created in accordance with the amount of phase shift. In the area of the phase contrast 804 of the reference interference pattern 801, there are the area of the phase contrast 805 of the interference pattern 802 and the area of the phase contrast 806 of the interference pattern 803. The amount of phase shift is affected by the direction of chirality structure and the thickness of an electron beam incident direction or the direction of a magnetization vector, the magnetization distribution in a film thickness direction, and the like, and the analysis of FIG. 8 enables more detailed molecular structure analysis and magnetization analysis.

FIG. 9 shows another example of a data analysis method according to the invention. In the upper diagram, in an observation area 900, there are the area of a reference interference pattern 901, an area 902 of a slightly weaker pattern intensity than that of the reference interference pattern 901, and an area 903 of a considerably weaker pattern intensity than that of the reference interference pattern 901. The image processing/analysis system 116 Fourier-transforms acquired data to quantify the intensities of the interference patterns. The lower diagram is an illustration in which contrasts are created in accordance with the intensities of the interference patterns. In the area of a contrast 904 corresponding to the pattern intensity of the reference interference pattern 901, there are the area of a contrast 905 corresponding to the pattern intensity of the interference pattern 902 and the area of a contrast 906 corresponding to the pattern intensity of the interference pattern 903. The intensity of an interference pattern depends, for example, on the uniformity of the phases of electron beams that have passed through the sample. Accordingly, if there is a minute chirality structure or magnetization distribution less than the resolution, since the electron beams of different phases interfere with each other, the intensity of the interference pattern becomes weak. That is, in the lower diagram of FIG. 9, the dark area may be an area of very minute chirality structure or magnetization distribution. Thus, findings about the internal structure of the sample can be obtained from the intensity distribution of the interference pattern.

Figure 10:
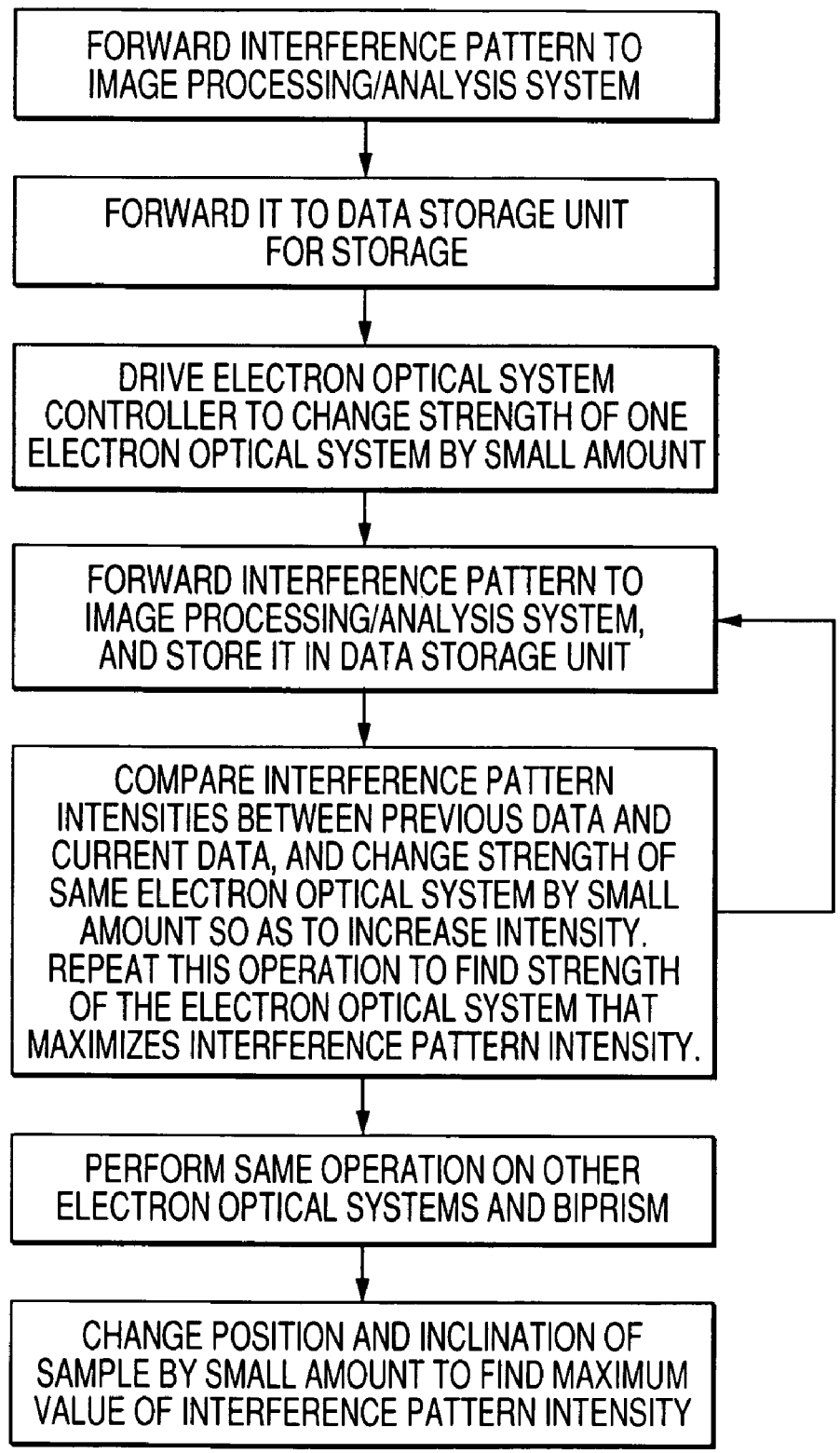
FIG. 10 is a flowchart for automatically adjusting electron optical systems based on interference pattern intensity, according to the invention.

FIG. 10 is a flowchart showing a method of adjusting the electron optical systems, the biprism, and the sample position and inclination using the image processing/analysis system. First, an acquired interference pattern is forwarded to the image processing/analysis system and stored in the data storage unit. Then, the strength of one electron optical system is changed by a small amount, and an interference pattern in this condition is forwarded to the image processing/analysis system and stored in the data storage unit. These two pieces of measurement data are analyzed, the interference pattern intensities are compared, and the strength of the electron optical system is changed by a small amount so as to increase the intensity. This operation is repeated to find the strength of the electron optical system that maximizes the interference pattern intensity. After the strength of the one electron optical system that maximizes the interference pattern intensity is obtained, the same operation is repeated for the other electron optical systems and the biprism to obtain optimum values. After all electron optical systems are set to the optimum values, the position and inclination of the sample are changed by a small amount for repetition of the above-mentioned measurement and analysis, thus obtaining optimum values for the interference pattern intensity. Further, after such operations are finished, the same adjustment is repeated for the first electron optical system, thereby enabling the optimum value to be obtained in more detail.

What is claimed is:

1. A transmission electron microscope comprising:
   a spin-polarized electron source;
   a spin rotator for rotating spin polarization of an electron beam emitted from the spin-polarized electron source;
   an optical system for irradiating a sample with the electron beam emitted from the spin-polarized electron source;
   a detector for detecting an electron that has passed through the sample; and
   a biprism disposed between the sample and the detector.

2. The transmission electron microscope according to claim 1, wherein the spin-polarized electron source is a photo cathode.

3. The transmission electron microscope according to claim 1, wherein the spin rotator includes two spin rotators, and at least one of the two spin rotators is a Wien filter type spin rotator.

4. The transmission electron microscope according to claim 1, further comprising an image processing/analysis system which receives an output signal of the detector and analyzes molecular structure or magnetization direction of the sample.

5. The transmission electron microscope according to claim 1, further comprising control means for adjusting the spin-polarized electron beam, the optical system, or the biprism, based on an output signal of the detector.

6. The transmission electron microscope according to claim 1, further comprising:
   a screen used as the detector; and
   means for adjusting a position of the sample and an angle with respect to an irradiating electron beam, based on a luminance signal obtained on the screen.

7. The transmission electron microscope according to claim 1, wherein Fourier transform is used to analyze an output signal of the detector.

8. The transmission electron microscope according to claim 1, further comprising:
   adjustment means for adjusting strength of the spin rotator; and
   an image processing/analysis system for analyzing molecular structure direction or magnetization direction of the sample by processing an output signal of the detector, the output signal being obtained by changing the strength of the spin rotator to change direction of the spin polarization of the electron beam and irradiating the sample with the electron beam.

* * * * *